United States Patent
Gu

(10) Patent No.: US 9,450,332 B2
(45) Date of Patent: Sep. 20, 2016

(54) USB MALE CONNECTOR AND ITS COMPANION ELECTRONIC PRODUCT

(71) Applicant: Huawei Device Co., LTD, Shenzhen (CN)

(72) Inventor: Jianglin Gu, Shenzhen (CN)

(73) Assignee: HUAWEI DEVICE CO., LTD., Shenzhen (CN)

( * ) Notice: Subject to any disclaimer, the term of this patent is extended or adjusted under 35 U.S.C. 154(b) by 353 days.

(21) Appl. No.: 13/960,251

(22) Filed: Aug. 6, 2013

(65) Prior Publication Data

US 2014/0049884 A1 Feb. 20, 2014

(30) Foreign Application Priority Data

Aug. 17, 2012 (CN) .......................... 2012 1 0293457

(51) Int. Cl.
| | | |
|---|---|---|
| *H01R 13/58* | (2006.01) | |
| *H05K 5/02* | (2006.01) | |
| *H01R 13/46* | (2006.01) | |
| *H01R 24/62* | (2011.01) | |

(52) U.S. Cl.
CPC .............. *H01R 13/58* (2013.01); *H01R 13/46* (2013.01); *H05K 5/0247* (2013.01); *H01R 24/62* (2013.01)

(58) Field of Classification Search
CPC ...... H01R 13/46; H01R 13/58; H01R 24/62; H05K 5/02
USPC ....... 361/679.01, 679.02, 600; 439/607, 626, 439/692
See application file for complete search history.

(56) References Cited

U.S. PATENT DOCUMENTS

| | | | |
|---|---|---|---|
| 7,128,608 B1* | 10/2006 | Chen ......................... | 439/607.53 |
| 7,134,900 B2* | 11/2006 | Chung ............... | H01R 13/6275 |
| | | | 439/353 |
| 7,837,510 B1* | 11/2010 | Hung et al. .................... | 439/660 |
| 2005/0245132 A1 | 11/2005 | Huang et al. | |
| 2011/0312218 A1* | 12/2011 | Song ......................... | 439/607.36 |
| 2011/0312223 A1 | 12/2011 | Wang et al. | |
| 2013/0210291 A1 | 8/2013 | Nomiyama et al. | |

FOREIGN PATENT DOCUMENTS

| | | |
|---|---|---|
| CN | 201590535 U | 9/2010 |
| CN | 201656023 U | 11/2010 |
| CN | 201754447 U | 3/2011 |

(Continued)

OTHER PUBLICATIONS

English Machine Translation of CN 201590535 U Published Sep. 22, 2010.*

(Continued)

*Primary Examiner* — Jeremy C Norris
*Assistant Examiner* — Ahmad D Barnes
(74) *Attorney, Agent, or Firm* — Slater Matsil, LLP

(57) ABSTRACT

A USB male connector and its companion electronic product are disclosed. The USB male connector includes an insulating body, a slot installed in the insulating body, and a reinforcement structure fixed in the slot. The strength of the reinforcement structure is greater than the strength of the insulating body. The USB male connector has an open end and a tail end that is opposite to the open end. A socket of the slot is located in the tail end of the USB male connector. The electronic product includes an electronic product body and the USB male connector. The USB male connector is fixedly connected to the electronic product body.

20 Claims, 3 Drawing Sheets

(56) References Cited

FOREIGN PATENT DOCUMENTS

| CN | 201918569 U | 8/2011 |
| JP | 2002369441 | 12/2002 |
| JP | 2005317503 A | 11/2005 |
| JP | 2010092811 | 4/2010 |
| JP | 20124125 A | 1/2012 |
| JP | 201238575 A | 2/2012 |
| JP | 3175979 U | 6/2012 |
| TW | M257029 U | 2/2005 |
| TW | M416259 U | 11/2011 |

OTHER PUBLICATIONS

International Search Report and Written Opinion received in Application No. PCT/CN2013/081659 mailed Nov. 28, 2013, 7 pages.

* cited by examiner

USB MALE CONNECTOR AND ITS COMPANION ELECTRONIC PRODUCT

CROSS-REFERENCE TO RELATED APPLICATIONS

This application claims priority to Chinese Patent Application No. 201210293457.7, filed on Aug. 17, 2012, which is hereby incorporated by reference in its entirety.

TECHNICAL FIELD

The present invention relates to the field of the connector structure, and in particular, to a USB male connector and its companion electronic product.

BACKGROUND

At present, the USB male connector uses steel plate cold rolled commercial (Steel Plate Cold rolled Commercial, SPCC) for its shell material. As shown in FIG. 1, when an electronic product with a USB male connector (for example, a data card) is used, a part of the USB male connector is fixed. Therefore, when the electronic product is pressed by a force F, the transition area A between the USB male connector 7 and the electronic product body 6 generates stress concentration, which is likely to cause the USB male connector to bend or crack. If a material with greater strength, such as stainless steel, is used for the shell to improve the strength of the USB male connector, the cost is high.

SUMMARY

The embodiments of the present invention provide a USB male connector and its companion electronic product, which improves the strength of the USB male connector at a lower cost, and therefore prevents the USB male connector from bending and cracking.

To solve the foregoing technical problem, an embodiment of the present invention adopts the following technical solution:

a USB male connector, including an insulating body, further includes:

a slot installed in the insulating body; and a reinforcement structure fixed in the slot; wherein:

the strength of the reinforcement structure is greater than the strength of the insulating body.

The USB male connector has an open end and a tail end that is opposite to the open end; and a socket of the slot located in the tail end of the USB male connector.

The slot is extended to the location three fifths to four fifths of the length away to the open end from the tail end.

The slot is extended to the location two thirds of the length away to the open end from the tail end.

The section of the reinforcement structure is linear, curve or wavy.

The reinforcement structure is made of steel, iron or an alloy material.

An electronic product includes:

an electronic product body; and the USB male connector; where:

the USB male connector is fixedly connected to the electronic product body.

The embodiment of the USB male connector and its companion electronic product provides a slot to insert the reinforcement structure in the process of making the insulating body of the USB male connector. The strength of the reinforcement structure is great, and therefore the strength of the fragile part where the USB male connector generates stress concentration is improved, which improves the strength of the USB male connector at a lower cost, and therefore prevents the USB male connector from bending and cracking.

BRIEF DESCRIPTION OF DRAWINGS

To illustrate the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

Figure 1:
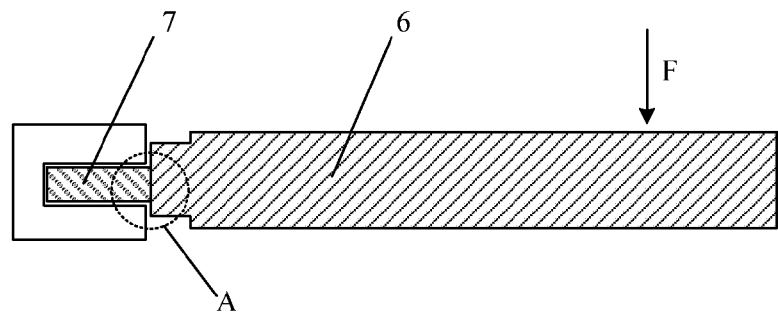
FIG. 1 is a force schematic diagram of a USB male connector on an electronic product in the prior art.
Figure 2:
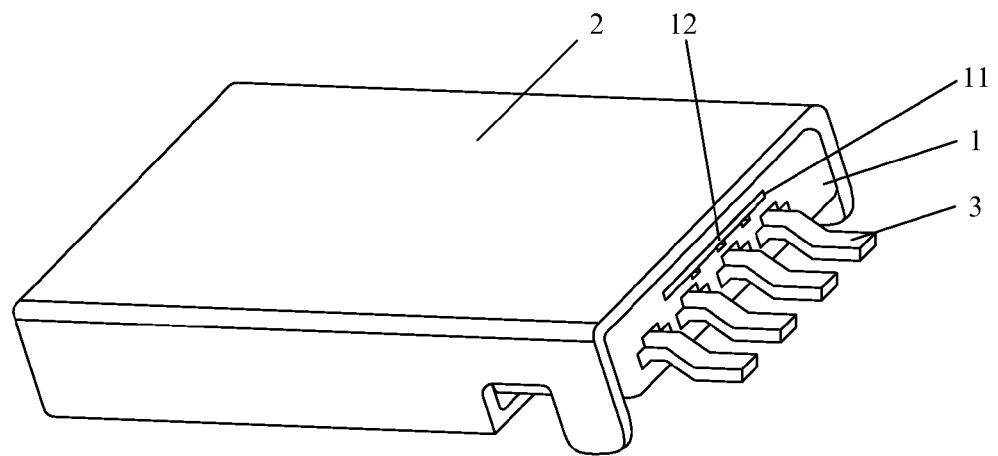
FIG. 2 is a structural schematic diagram of a USB male connector according to an embodiment of the present invention.

As shown in FIG. 2, an embodiment of the present invention provides a USB male connector, including an insulating body 1, a shell 2, and a contact terminal 3. Specifically, the insulating body 1 usually uses the plastic or rubber material and is installed in the shell 2, and the contact terminal 3 is installed in the insulating body 1. Further, the USB male connector includes a slot 11 installed in the insulating body 1, and a reinforcement structure 12 fixed in the slot 11, where the strength of the reinforcement structure 12 is greater than the strength of the insulating body 1.

The principle of using the reinforcement structure to improve the strength of the USB male connector originates from a reinforced concrete structure. A slot is reserved in the process of making the insulating body, so as to insert the reinforcement structure to the slot. The strength of the reinforcement structure is great, and therefore, the strength of the fragile part where the USB male connector generates stress concentration is improved, which improves the strength of the USB male connector at a lower cost, and therefore prevents the USB male connector from bending and cracking.

Figure 3:
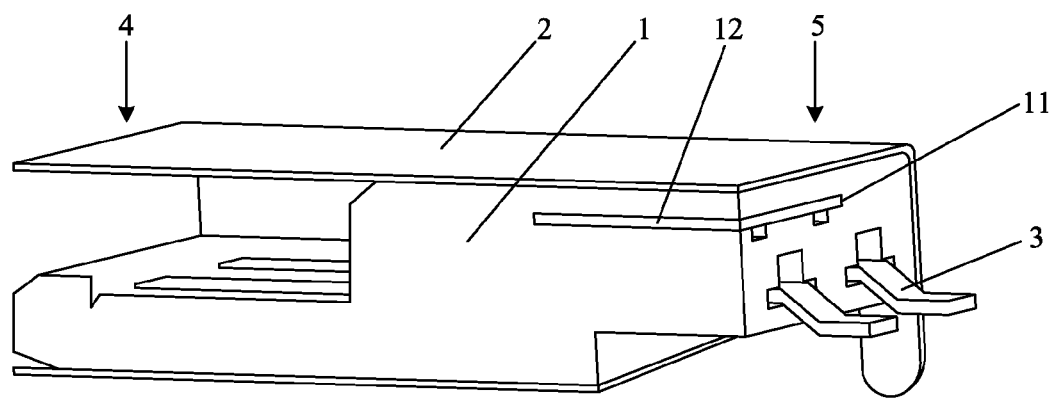
FIG. 3 is a schematic sectional view of the USB male connector shown in FIG. 2.

Further, as shown in FIG. 3, the USB male connector has an open end 4 and a tail end 5 that is opposite to the open end 4. The stress concentration of the USB male connector is generated in the transition area between the USB male connector and an electronic product body, and the tail end 5 is configured to connect an electronic product body. Therefore, the slot 11 is located at the tail end 5 of the USB male connector, enabling the slot 11 to extend to the tail end 5 from the open end 4.

Further, the slot 11 is extended to the location three fifths to four fifths of the length away to the open end 4 from the tail end 5.

Preferably, the slot 11 is extended to the location two thirds of the length away to the open end 4 from the tail end 5.

Figure 4:
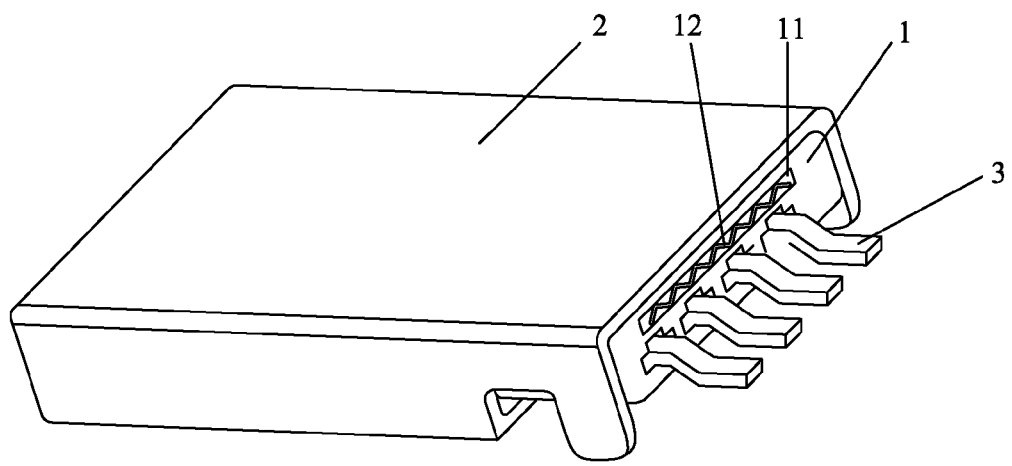
FIG. 4 is a structural schematic diagram of another USB male connector according to an embodiment of the present invention.
Figure 5:
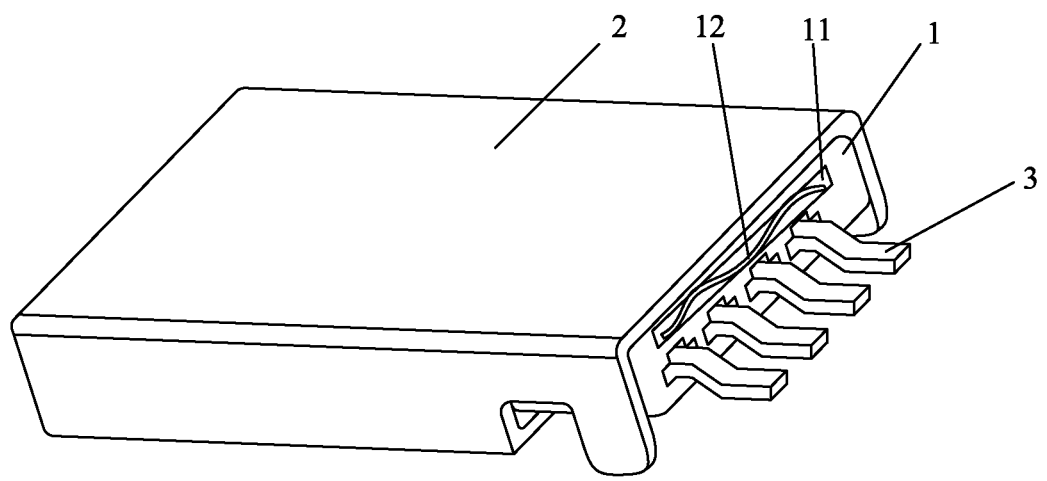
FIG. 5 is a structural schematic diagram of another USB male connector according to an embodiment of the present invention.

Further, the reinforcement structure may take various shapes and the number of reinforcement structures may be one or more. Preferably, as shown in FIG. 2, the section of the reinforcement structure 12 is linear. That is, the reinforcement structure 12 is a reinforcement panel. As shown in FIG. 3, the reinforcement structure may be curve or wavy, so as to bear greater bending force. It should be noted that the slot can take various shapes. As shown in FIG. 4 or FIG. 5, the shape of the section of the slot 11 is rectangle. After the reinforcement structure 12 is inserted into the slot 11, peaks and troughs of the curve or wavy reinforcement structure fit the internal surface of the slot 11 closely. Therefore, the reinforcement structure is fixed. Or, the slot can take the same shape as the shape of the reinforcement structure, which enables the reinforcement structure to fit most of the internal surface of the slot closely. Therefore, the reinforcement structure is fixed after the reinforcement structure is inserted into the slot. In other words, what is needed only is that the slot can fix the inserted reinforcement structure.

Further, the reinforcement structure 12 is made of steel, iron or alloy material.

It should be noted that the USB male connector may be various types, such as USB-A, USB-B, or Micro USB.

A slot is reserved in the process of making the insulating body, so as to insert the reinforcement structure to the slot. The strength of the reinforcement structure is great, and therefore, the strength of the fragile part where the USB male connector generates stress concentration is improved, which improves the strength of the USB male connector at a lower cost, and therefore, prevents the USB male connector from bending and cracking.

Figure 6:
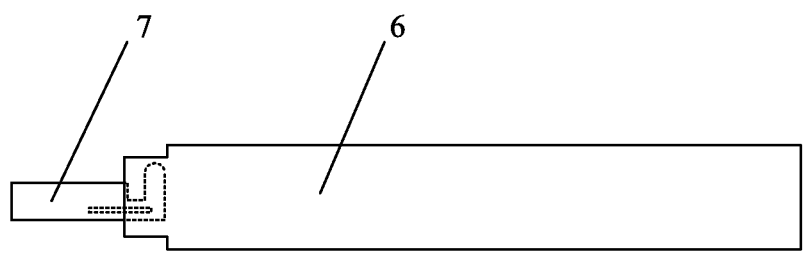
FIG. 6 is a structural schematic diagram of an electronic product according to an embodiment of the present invention.

As shown in FIG. 6, an embodiment of the present invention further provides an electronic product. The electronic product includes an electronic product body 6 and a USB male connector 7 described in the foregoing embodiment, where the USB male connector 7 is fixedly connected to the electronic product body 6. Specifically, the tail end of the USB male connector 7 is fixedly connected to the electronic product 6, and a contact terminal of the USB male connector 7 is connected to the electronic product body 6. The specific structure of the USB male connector 7 is the same as that of the foregoing embodiment, which is not described herein again.

The electronic product can be a data card, a USB flash disk, or others.

A slot is reserved in the process of making the insulating body of the USB male connector, so as to insert the reinforcement structure to the slot. The strength of the reinforcement structure is great, and therefore, the strength of the fragile part where the USB male connector generates stress concentration is improved, which improves the strength of the USB male connector at a lower cost, and therefore prevents the USB male connector from bending and cracking.

The foregoing descriptions are merely specific embodiments of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A USB male connector, comprising:
an insulating body;
a slot installed in the insulating body; and
a reinforcement structure completely disposed within the slot, wherein a strength of the reinforcement structure is greater than a strength of the insulating body, wherein the reinforcement structure and the slot have a same shape and extend laterally directly over two or more contact terminals that are disposed in the insulating body and are laterally spaced apart;
wherein the reinforcement structure has a first surface exposed at a tail end of the USB male connector and extends, within the slot, into the insulating body from a surface of the insulating body at the tail end, and wherein each surface of the reinforcement structure other than the first surface is completely enclosed by the insulating body.

2. The USB male connector according to claim 1, further comprising a socket of the slot located in the tail end of the USB male connector, the tail end opposite an open end of the USB male connector, wherein the socket is an end of the slot and is open at the tail end of the USB male connector.

3. The USB male connector according to claim 2, wherein the slot is extended to a location three fifths to four fifths of a length away from the open end from the tail end.

4. The USB male connector according to claim 3, wherein the slot is extended to a location two thirds of the length away from the open end from the tail end.

5. The USB male connector according to of claim 1, wherein the reinforcement structure has a linear cross-section.

6. The USB male connector according to of claim 1, wherein the reinforcement structure has a curved cross-section.

7. The USB male connector according to of claim 1, wherein the reinforcement structure has a wavy cross-section.

8. The USB male connector according to claim 1, wherein the reinforcement structure is made of steel.

9. The USB male connector according to claim 1, wherein the reinforcement structure is made of iron.

10. The USB male connector according to claim 1, wherein the reinforcement structure is made of an alloy material.

11. An electronic product, comprising:
an electronic product body;
electronics within the electronic product body; and
a USB male connector fixedly connected to the electronic product body and electrically connected to the electronics, the USB male connector comprising an insulating body, a slot installed in the insulating body, and a reinforcement structure completely disposed within the slot, wherein a strength of the reinforcement structure is greater than a strength of the insulating body, and wherein the reinforcement structure and the slot have a same shape and extend laterally directly over two or more contact terminals that are disposed in the insulating body and are laterally spaced apart;

wherein the reinforcement structure has a first surface exposed at a tail end of the USB male connector and extends, within the slot, into the insulating body from a surface of the insulating body at the tail end, and wherein each surface of the reinforcement structure other than the first surface is completely enclosed by the insulating body; and wherein the reinforcement structure extends from within the electronic product body to outside of the electronic product body.

12. The electronic product according to claim 11, further comprising a socket of the slot located in the tail end of the USB male connector, the tail end opposite an open end of the USB male connector, wherein the socket is an end of the slot and is open at the tail end of the USB male connector.

13. The electronic product according to claim 12, wherein the slot is extended to a location three fifths to four fifths of a length away from the open end from the tail end.

14. The electronic product according to claim 13, wherein the slot is extended to a location two thirds of the length away from the open end from the tail end.

15. The electronic product according to claim 11, wherein the reinforcement structure has a linear cross-section.

16. The electronic product according to claim 11, wherein the reinforcement structure has a curved cross-section.

17. The electronic product according to claim 11, wherein the reinforcement structure has a wavy cross-section.

18. The electronic product according to claim 11, wherein the reinforcement structure is made of steel.

19. The electronic product according to claim 11, wherein the reinforcement structure is made of iron.

20. The electronic product according to claim 11, wherein the reinforcement structure is made of an alloy material.

* * * * *